US012593668B2

(12) United States Patent
Fan et al.

(10) Patent No.: US 12,593,668 B2
(45) Date of Patent: Mar. 31, 2026

(54) SHALLOW AND DEEP CONTACTS WITH STITCHING

(71) Applicant: INTERNATIONAL BUSINESS MACHINES CORPORATION, Armonk, NY (US)

(72) Inventors: Su Chen Fan, Cohoes, NY (US); Stuart Sieg, Albany, NY (US); Dominik Metzler, Clifton Park, NY (US); Indira Seshadri, Niskayuna, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 884 days.

(21) Appl. No.: 17/807,006

(22) Filed: Jun. 15, 2022

(65) Prior Publication Data

US 2023/0411212 A1     Dec. 21, 2023

(51) Int. Cl.
| | |
|---|---|
| *H01L 21/768* | (2006.01) |
| *H01L 21/033* | (2006.01) |
| *H01L 21/311* | (2006.01) |
| *H01L 23/522* | (2006.01) |
| *H01L 23/528* | (2006.01) |
| *H10P 50/00* | (2026.01) |
| *H10P 76/40* | (2026.01) |
| *H10W 20/00* | (2026.01) |
| *H10W 20/41* | (2026.01) |
| *H10W 20/42* | (2026.01) |

(52) U.S. Cl.
CPC ........... *H10W 20/069* (2026.01); *H10P 50/73* (2026.01); *H10P 76/4085* (2026.01); *H10W 20/056* (2026.01); *H10W 20/084* (2026.01); *H10W 20/089* (2026.01); *H10W 20/42* (2026.01); *H10W 20/435* (2026.01)

(58) Field of Classification Search
CPC ........... H01L 21/0337; H01L 21/76807; H01L 21/31144; H01L 21/76816
See application file for complete search history.

(56) References Cited

U.S. PATENT DOCUMENTS

| | | | |
|---|---|---|---|
| 8,048,790 B2 | 11/2011 | Soss | |
| 9,224,617 B2 | 12/2015 | Pritchard | |
| 9,607,893 B1 | 3/2017 | Zhang | |
| 10,008,500 B2 | 6/2018 | Cheng | |
| 10,192,780 B1 | 1/2019 | Wang | |
| 10,784,119 B2 | 9/2020 | Srivastava | |
| 10,790,376 B2 | 9/2020 | Xie | |
| 10,818,597 B2 * | 10/2020 | Liu | H01L 21/76838 |
| 10,923,388 B2 | 2/2021 | Huang | |

(Continued)

*Primary Examiner* — Britt Hanley
*Assistant Examiner* — Victor V Barzykin
(74) *Attorney, Agent, or Firm* — Jeffrey Ingalls

(57) ABSTRACT

A semiconductor device is provided. The semiconductor device includes an interlayer dielectric layer; and a plurality of metal contacts formed in the interlayer dielectric layer. The plurality of metal contacts include a plurality of shallow metal contacts having a first depth, and a plurality of deep metal contacts having a second depth that is greater than the first depth, wherein a first one of the shallow metal contacts overlaps and directly contacts a first one of the deep metal contacts, and wherein the plurality of metal contacts have an equal spacing therebetween.

20 Claims, 8 Drawing Sheets

(56) References Cited

U.S. PATENT DOCUMENTS

| | | | | |
|---|---|---|---|---|
| 2007/0007658 A1* | 1/2007 | Tomita | ............... | H01L 23/5329 |
| | | | | 257/774 |
| 2013/0089984 A1 | 4/2013 | Raghunathan | | |
| 2014/0308761 A1 | 10/2014 | Kuo | | |
| 2015/0214064 A1 | 7/2015 | Pritchard et al. | | |
| 2017/0352661 A1 | 12/2017 | Cheng et al. | | |
| 2020/0058757 A1 | 2/2020 | Xie et al. | | |

* cited by examiner

100

100

100

104     104     104

108     108

102

100

104     102     104     104

A

100

100

SHALLOW AND DEEP CONTACTS WITH STITCHING

BACKGROUND

The present disclosure relates to fabrication methods and resulting structures for contacts in electrical devices, such as semiconductor devices. More specifically, the present disclosure relates to fabrication methods and resulting structures that have a self-aligned spacing between shallow and/or deep electrical contacts that include stitching.

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front end of the line (FEOL), back end of the line (BEOL), and the section that connects those two together, the middle of the line (MOL). The FEOL is made up of the semiconductor devices, e.g., transistors, the BEOL is made up of interconnects and wiring, and the MOL is an interconnect between the FEOL and BEOL.

Certain contacts (or wirings) formed within these FEOL, BEOL and MOL layers may be shallow, and other wirings may be deeper. Some of the shallower contact may overlap (and contact) with the deeper contacts, and the shallower contacts may have a different footprint (or shape, or surface area in plan view (or top view)) resulting in the stitching (i.e., the creation of interconnects). With the decreasing scale of IC devices, it may be desirable to have consistent spacing between different contacts or wirings to minimize the chances for electrical shorting.

SUMMARY

Embodiments of the present disclosure relate to a semiconductor device. The semiconductor device includes an interlayer dielectric layer; and a plurality of metal contacts formed in the interlayer dielectric layer. The plurality of metal contacts include a plurality of shallow metal contacts having a first depth, and a plurality of deep metal contacts having a second depth that is greater than the first depth, wherein a first one of the shallow metal contacts overlaps and directly contacts a first one of the deep metal contacts, and wherein the plurality of metal contacts have an equal spacing therebetween.

Embodiments of the present disclosure relate to a method of manufacturing a semiconductor device. The method includes: forming a plurality of metal contacts in an interlayer dielectric layer, the plurality of metal contacts including a plurality of shallow metal contacts having a first depth, and a plurality of deep metal contacts having a second depth that is greater than the first depth, wherein a first one of the shallow metal contacts overlaps and directly contacts a first one of the deep metal contacts, and wherein the plurality of metal contacts have an equal spacing therebetween.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure.

The drawings are only illustrative of certain embodiments and do not limit the disclosure.

DETAILED DESCRIPTION

Figure 1A:
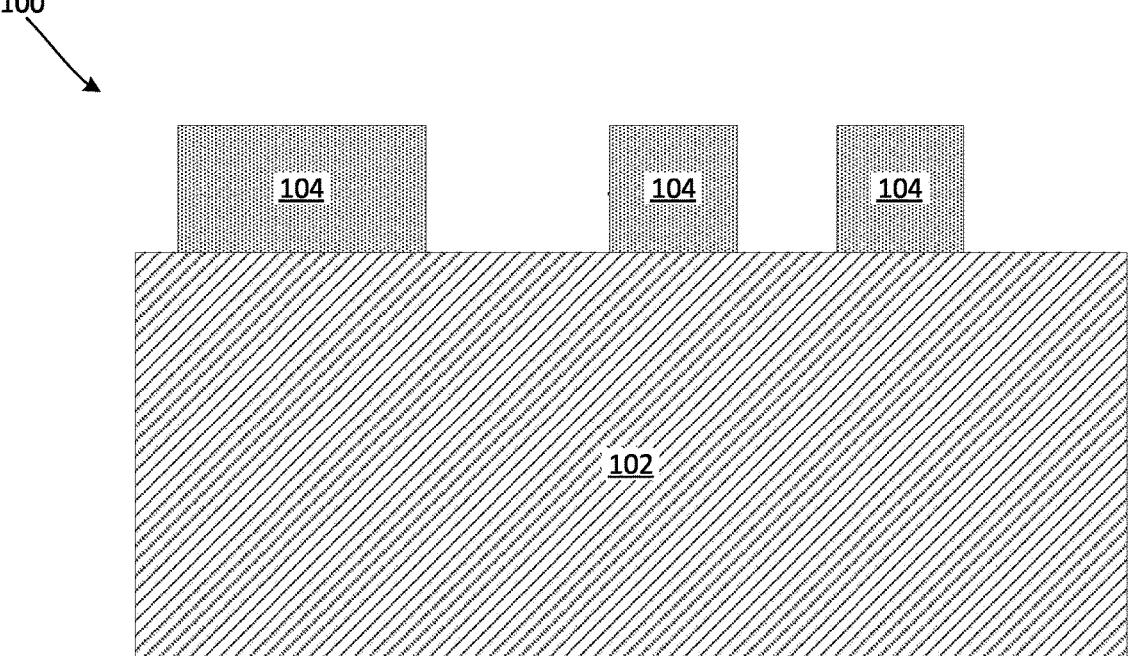
FIG. 1A is a cross-sectional view of an electronic device at an intermediate stage of the fabrication process and taken along the A line of FIG. 1B, according to embodiments.

The present disclosure generally relates to metal contacts (or wirings), and more particularly to semiconductor devices and methods for their fabrication. Conventional techniques for forming these FEOL, MOL and BEOL contacts inherently include risks of shorts occurring between the adjacent contacts. For example, in related manufacturing technologies, the lithography mask used to form shallow contacts may be different than the mask used to form the deep contacts. The use of different masks can result in edge placement errors where the masks do no line up precisely, which can result in shorting. However, the present embodiments provide for the formation of these contacts in a self-aligned manner without incurring the above-mentioned risks of shorts. The metal contacts described herein may be described as metal gates, for example, however it should be appreciated that the present embodiments may be applied equally to other types of metal structures and by no means are limited to gate contact structures. For example, the contacts may be metal interconnects in another embodiment such as in a BEOL structure, and in such embodiment metal interconnects may be formed on top of, for example, other metal interconnects and/or middle-of-line (MOL) structures. More generally, the present embodiments may apply to any metal contacts or interconnects in a FEOL, MOL or BEOL layer.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, illustrative embodiments for forming a semiconductor device will be described below with reference to FIGS. 1A-8B. Note that the same reference numeral (100) is used to denote the semiconductor structure through the various intermediate fabrication stages illustrated in FIGS. 1A through 8B. Note also that the semiconductor structure described herein can also be considered to be a semiconductor device and/or an integrated circuit, or some part thereof. For the purpose of clarity, some fabrication steps leading up to the production of the semiconductor structure as illustrated in FIGS. 1A-8B are omitted. In other words, one or more well-known processing steps which are not illustrated but are well-known to those of ordinary skill in the art have not been included in the figures.

As used herein, the term "space" or "space value" or "gap", and the like, refer to a distance between a first semiconductor structure (or more generally from one structure to another such as two different electrical contacts or metal wirings) to a corresponding second semiconductor structure, in a pattern of semiconductor structures disposed on a substrate. The points of reference may be located, for example, at and endpoint of a semiconductor structure and a corresponding start point of an adjacent semiconductor structure. For example, generally with reference to FIG. 8, a space value or gap might be measured along a horizontal critical dimension (i.e., dimension D in FIG. 8) from an end point of a first structure, e.g., the leftmost shallow contact metal 116, to a start point of an adjacent second structure, e.g., the second leftmost shallow contact metal 116. Space value measurements, for example, could be taken along a horizontal critical dimension in a pattern of first, second, third, and fourth structures, measured as the gap between structures. These patterns of adjacent semiconductor structures may be used, for example, to fabricate one or more of: FET semiconductor devices, transistor semiconductor devices, vertical metallization structures in metallization layers, such as in front-end-of-line (FEOL) metallization layers, in middle-of-line (MOL) metallization layers and in back-end-of-line (BEOL) metallization layers, and the like.

Figure 1B:
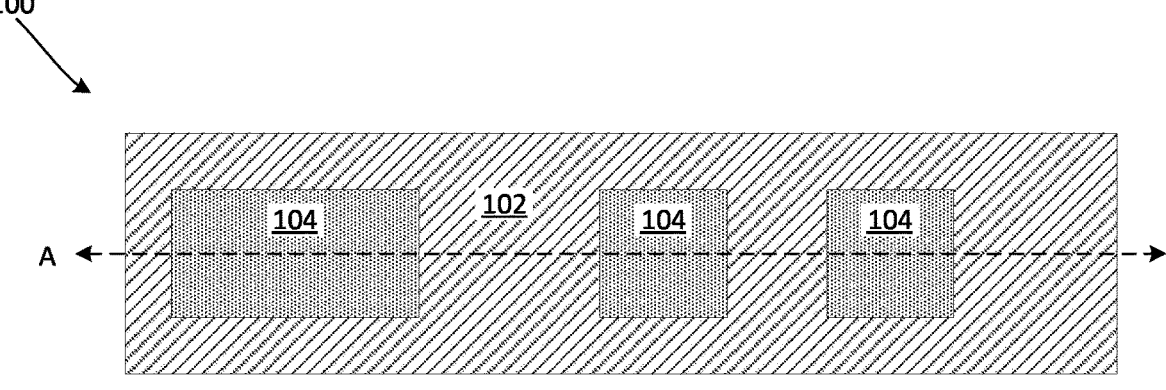
FIG. 1B is a top view of the semiconductor device of FIG. 1A, according to embodiments.

Referring now to the drawings in which like numerals represent the same or similar elements and initially to FIG. 1A, this figure depicts a cross-sectional view of the electronic device 100 shown in FIG. 1B taken along line Y2, according to embodiments. Methods for fabricating a semiconductor structure or semiconductor device or electronic device 100 incorporating a BEOL interconnect with metal patterning will now be discussed in further detail with reference to FIGS. 1A through 8B, which schematically illustrate an electronic device 100 at various intermediate stages of fabrication. The term electronic device 100 used herein may include a semiconductor or integrated circuit at any point in processing or fabrication of the electronic device 100. In addition, the following discussion will identify various stages of fabrication of the electronic device 100. It is to be understood that the intermediate stages are exemplative only. More or less intermediate stages may be implemented in processing the electronic device 100, and the disclosed stages may be in different orders or sequences. In addition, one or more processes may be incorporated within various intermediate stages as described herein, and one or more processes may be implemented in intermediate stages as otherwise described herein.

BEOL fabrication occurs subsequent to middle of line (MOL) and front-end of line (FEOL) processing of the semiconductor structure. The MOL and FEOL processes are not shown for simplicity. To begin, FIG. 1A is a schematic cross-sectional side view of a semiconductor structure 100 at a first intermediate stage of fabrication comprising a semiconductor substrate (not shown) and a plurality of layers or materials disposed on the semiconductor substrate. The layers will be processed in accordance with the methodologies described herein to provide an interconnect structure, e.g., a BEOL interconnect structure, for incorporation within the electronic device 100.

In general, the semiconductor substrate, at this stage in the fabrication process, includes one or more layers such as, for example, a semiconductor wafer substrate layer, a FEOL layer formed on the semiconductor wafer substrate, and a MOL layer formed on the FEOL layer. The semiconductor substrate may comprise one of different types of semiconductor wafer substrate structures and materials. For example, in one embodiment, the semiconductor wafer substrate can be a bulk semiconductor wafer substrate that is formed of silicon (Si) or germanium (Ge), or other types of semiconductor substrate materials which are commonly used in bulk semiconductor fabrication processes such as a silicon-germanium alloy, compound semiconductor materials (e.g., III-V), etc. In another embodiment, the semiconductor wafer substrate may comprise an SOI (silicon-on-insulator) substrate, GeOI (germanium-on-insulator) substrate, or other types of semiconductor-on-insulator substrates which comprise an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL layer comprises various semiconductor devices and components that are formed in or on an active surface of the semiconductor wafer substrate to provide integrated circuitry for a target application. For example, the FEOL layer comprises field-effect transistor (FET) devices (such as FinFET devices, vertical FET devices, planar FET devices, etc.), bipolar transistors, diodes, capacitors, inductors, resistors, isolation devices, etc., which are formed in or on the active surface of the semiconductor wafer substrate. In general, FEOL processes typically include preparing the semiconductor wafer substrate, forming isolation structures (e.g., shallow trench isolation), forming device wells, patterning gate structures, forming spacers, forming source/drain regions (e.g., via implantation), forming silicide contacts on the source/drain regions, forming stress liners, etc. The MOL layer comprises a PMD (pre-metal dielectric layer) and conductive contacts (e.g., source/drain contacts, gate contacts, etc.) that are formed in the PMD layer. The PMD layer is formed on the components and devices of the FEOL layer. The conductive contacts of the MOL layer provide electrical connections between the integrated circuitry of the FEOL layer and a first level of metallization of the BEOL interconnect that is formed over the FEOL/MOL layers.

With continued reference to FIGS. 1A and 1B, an interlayer dielectric substrate 102 is disposed on the semiconductor substrate (not shown), which may include one or more layers of various materials. In one exemplative embodiment, the interlayer dielectric substrate 102 comprises a "low-K" insulating/dielectric material such as octamethylcyclotetrasiloxane (OMCTS). The interlayer dielectric substrate 102 may, in the alternative, include a layer of silicon oxide (e.g. $SiO_2$), silicon nitride (SiN), silanol (SiOH), hydrogenated silicon nitride (SiNH), silicon carbide (SiC), silicon carbon nitride (SiCN), hydrogenated silicon carbide (SiCH), fluorine-doped silicon oxide (SiOF), carbon doped oxide (CDO), SiOC films or SiOCH low-κ films and other similar types of insulating/dielectric materials or porous dielectrics which are non-reactive with the metallic material that is used to form metallic interconnect structures in the BEOL interconnect structure. The interlayer dielectric substrate 102 may also include, for example, any suitable dielectric material such as silicon oxide, silicon nitride, hydrogenated silicon carbon oxide, silicon based low-K dielectrics, flowable oxides, porous dielectrics, or organic dielectrics including porous organic dielectrics. Other non-limiting examples of suitable low-κ dielectric materials include a spin-on-glass, a flowable oxide, a high density plasma oxide, borophosphosilicate glass (BPSG), or any combination thereof. The interlayer dielectric substrate 102, in an embodiment, is designed to minimize capacitive coupling, and has a dielectric constant of 3.0 or less. In one exemplary embodiment, the interlayer dielectric substrate 102 has a thickness in a range of about 20 nm to about 800 nm. The interlayer dielectric substrate 102 is formed using known deposition techniques, such as, for example, ALD (atomic layer deposition), CVD (chemical vapor deposition) PECVD (plasma-enhanced CVD), or PVD (physical vapor deposition), or spin-on deposition.

On top of the interlayer dielectric substrate 102 is a metallic layer 104 of, for example, ruthenium. Other metals for the metallic layer 104 are also envisioned including, e.g., copper, cobalt, titanium, copper, aluminum, tungsten, or iridium, or alloys thereof. The metallic layer 104 may be applied via a blanket deposition process and subsequently planarized. Known dry deposition techniques such as ALD, PVD or CVD or wet deposition techniques such as electroplating, and electroless plating, etc. may be used to deposit the metallic layer 104. The planarization process can be implemented using a chemical-mechanical polish (CMP) process with a suitable etch slurry. The thickness or height of the metallic layer 104 may range between about 60 nm to about 80 nm, or be about 70 nm, for example. Then, as shown in FIGS. 1A and 1B, a mandrel RIE (subtractive metal etch) process is performed to form the patterned of the metallic layer 104 shown in FIGS. 1A and 1B. As will be described in further detail below, the deep contact (CR) size, the shallow contact (CA) size, the CR space to the adjacent CA, and the CA space to the adjacent CA space are defined by the size and dimensions of these patterned portions of the metallic layer 104.

Figure 2A:
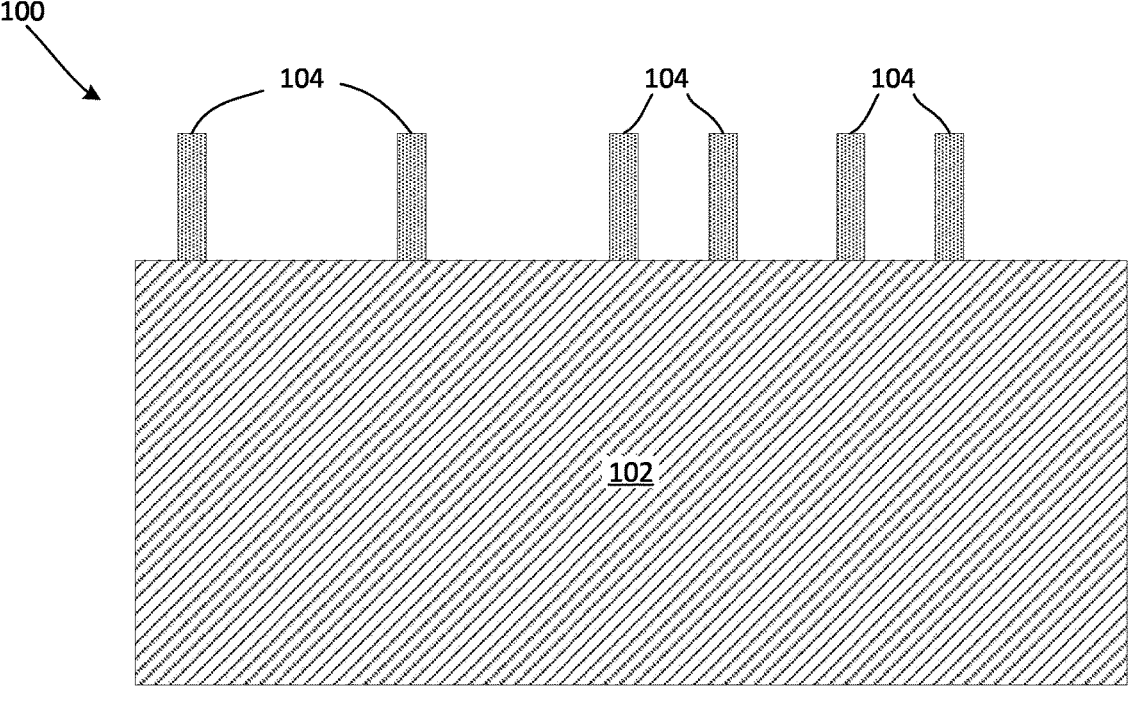
FIG. 2A is a cross-sectional view of the semiconductor device of FIG. 1A after additional fabrication operations and taken along the A line of FIG. 2B, according to embodiments.
Figure 2B:
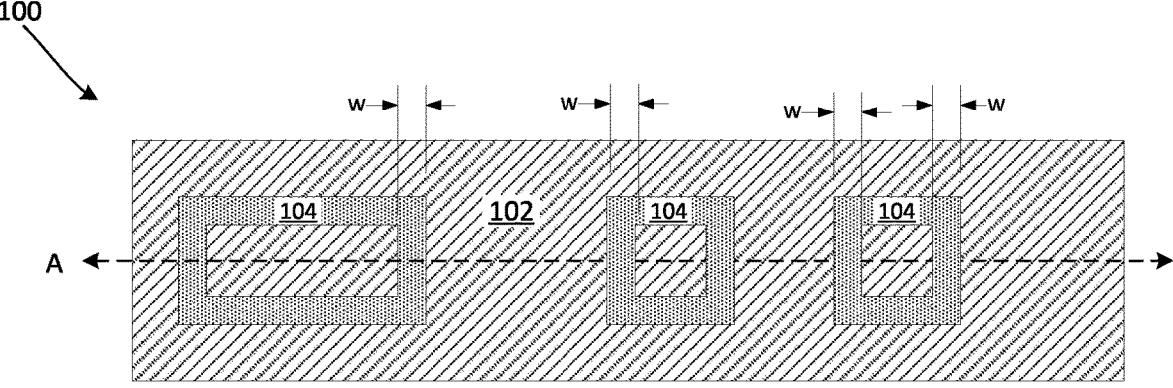
FIG. 2B is a top view of the semiconductor device of FIG. 2A, according to embodiments.

Referring now to FIGS. 2A, this figure depicts a cross-sectional view of the electronic device 100 shown in FIG. 1A after additional manufacturing operations and taken along line A of FIG. 2B, according to embodiments. FIG. 2B is the top-down view (or plan view of FIG. 2A). As shown in FIG. 2A, a metal oxidation process is performed on the metallic layer 104. After the metallic layer 104 has been oxidized, an organic planarization layer (OPL) (not shown) is formed to fill in the spaces between the adjacent metallic layer 104 portions. Then, a planarization process such as CMP is performed to planarize the top surface of the electronic device 100. After this process is performed, a mandrel pull operation is performed on the metallic layer 104 portions resulting in the ring structures (i.e., a square or rectangular section with an opening in the middle, as shown in FIG. 2B) shown in FIG. 2B. As will be described in further detail below, these ring-shaped structures of the metallic layer 104 will allow for both the deep contacts (CR) and the shallow contacts (CA) to be performed in sequence without the need to two separate masks. As was discussed above, in related manufacturing technologies, using two separate masks to separate form the deep and shallow contacts can result in alignment errors which can be problematic when critical dimension sized are in the 5-24 nm range (i.e., resulting in electrical shorts). However, in the present embodiments, these misalignment errors can be eliminated by the formation of these ring-shaped structures of the metallic layer 104 because the widths W of the sides of the structures are the same.

Figure 3A:
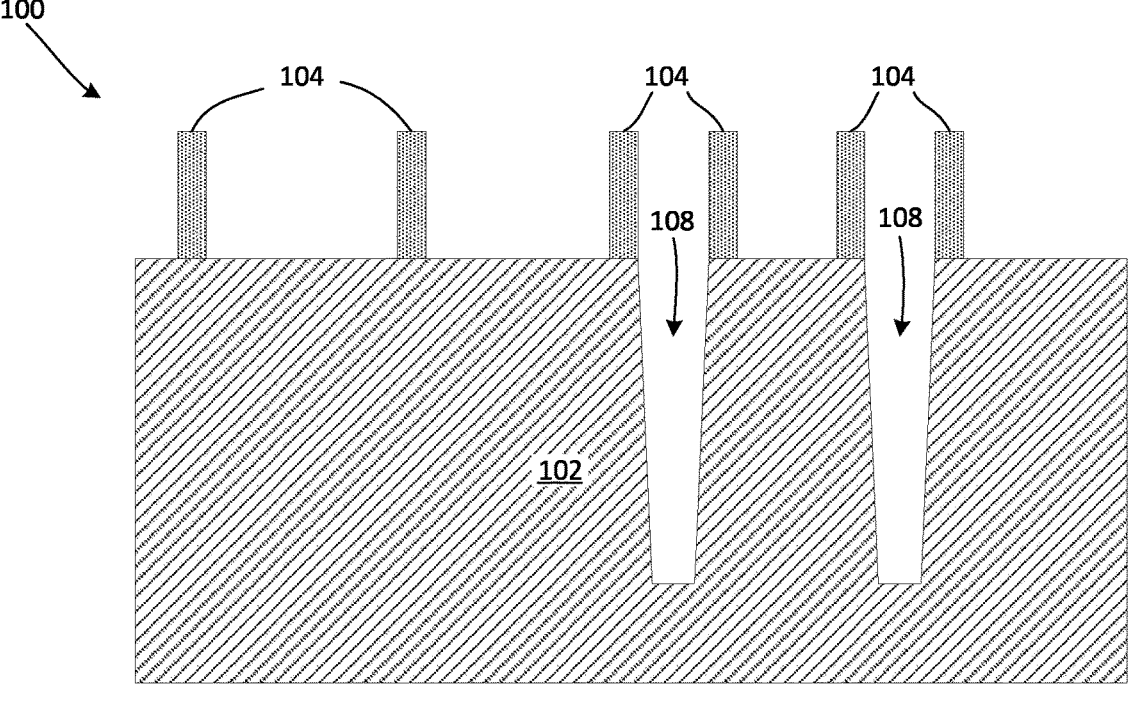
FIG. 3A is a cross-sectional view of the semiconductor device of FIG. 2A after additional fabrication operations and taken along the A line of FIG. 2B, according to embodiments.
Figure 3B:
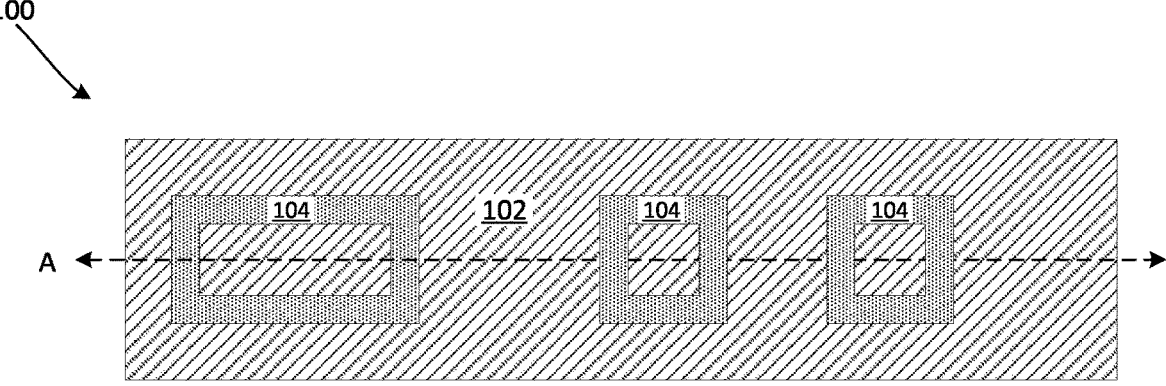
FIG. 3B is a top view of the semiconductor device of FIG. 3A, according to embodiments.

Referring now to FIGS. 3A, this figure depicts a cross-sectional view of the electronic device 100 shown in FIG. 2A after additional manufacturing operations and taken along line A of FIG. 3B, according to embodiments. FIG. 3B is the top-down view (or plan view of FIG. 3A). As shown in FIG. 3A, the deep contact vias 108 are formed. The formation of these deep contact vias 108 may be achieved by a combination of deep contact (CR) lithography and deep contact (CR) reactive ion etching (RIE). Thus, by using the ring-shaped portions of the two smaller (middle and right) portions of the metallic layer 104 as a mask, the deep contacts 108 can be formed in a precise location.

Figures 4A, 4B:
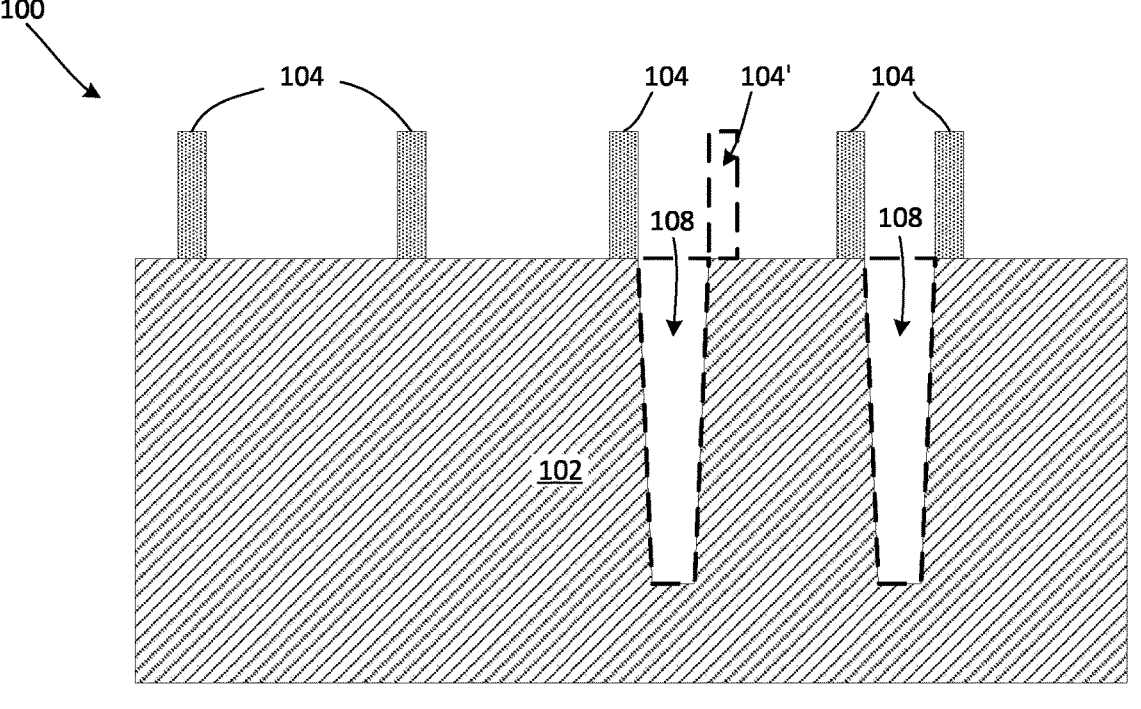
FIG. 4A is a cross-sectional view of the semiconductor device of FIG. 3A after additional fabrication operations and taken along the A line of FIG. 4B, according to embodiments.
FIG. 4B is a top view of the semiconductor device of FIG. 4A, according to embodiments.

Referring now to FIGS. 4A, this figure depicts a cross-sectional view of the electronic device 100 shown in FIG. 3A after additional manufacturing operations and taken along line A of FIG. 4B, according to embodiments. FIG. 4B is the top-down view (or plan view of FIG. 4A). As shown in FIGS. 4A and 4B, a portion 104' of the middle one of the ring-shaped portions of the metallic layer 104 is selectively removed (i.e., a spacer cut). This essentially changes the shape of the middle mask into a C-shaped structure before performing the shallow contact via formation. Therefore, this allows for stitching (the direct contact and overlapping) of the deep contact and a shallow contact in subsequent operations (i.e., creating an interconnect). In certain embodiments, the portion 104' is removed with a combination of lithography and reactive ion etching (RIE).

Figure 5A:
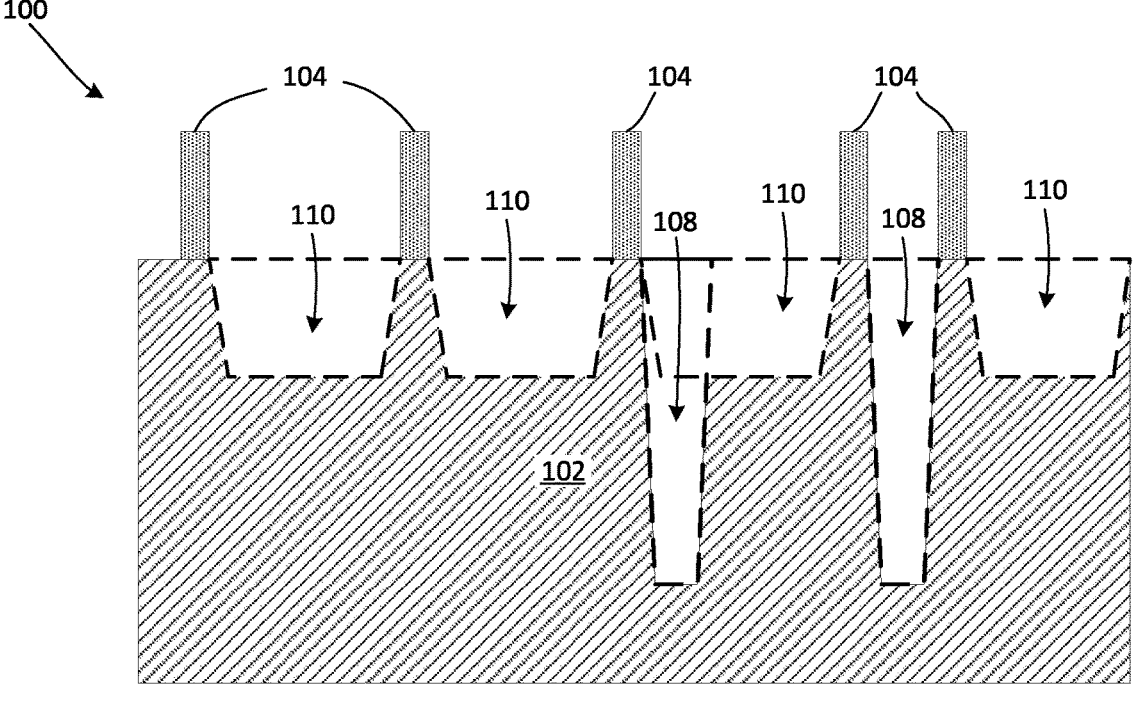
FIG. 5A is a cross-sectional view of the semiconductor device of FIG. 4A after additional fabrication operations and taken along the A line of FIG. 5B, according to embodiments.
Figure 5B:
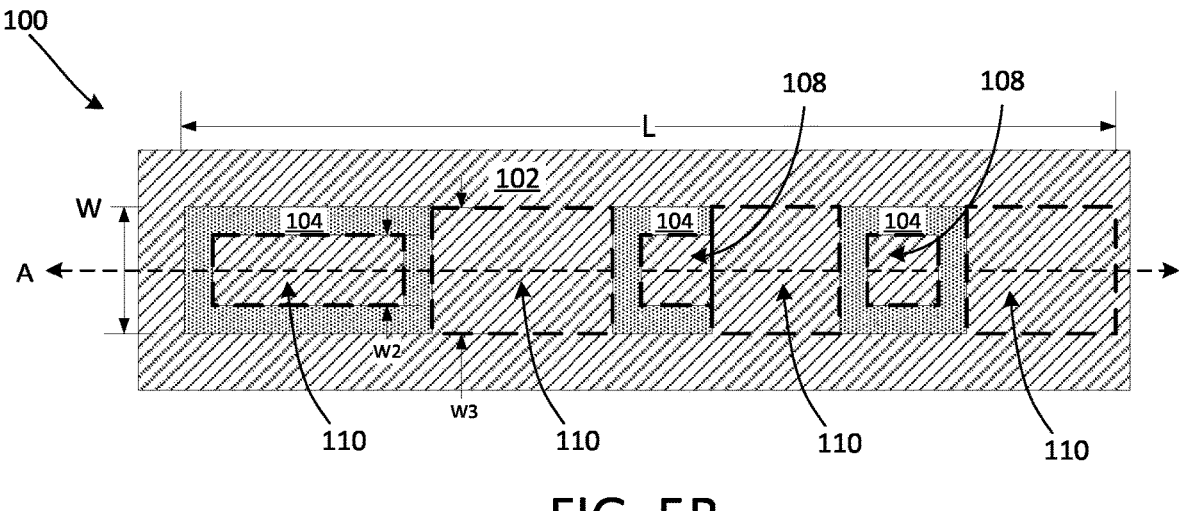
FIG. 5B is a top view of the semiconductor device of FIG. 5A, according to embodiments.

Referring now to FIGS. 5A, this figure depicts a cross-sectional view of the electronic device 100 shown in FIG. 4A after additional manufacturing operations and taken along line A of FIG. 5B, according to embodiments. FIG. 5B is the top-down view (or plan view of FIG. 5A). As shown in FIG. 5B, a combination of lithography and RIE is used to form the shallow contact vias 110. In particular, FIG. 5B shows an area having a width (W) and a length (L) that is the area where the RIE is performed. As can be seen in FIG. 5B, this width (W) is larger than the width of the openings of the ring-shaped portions of the metallic layer 104 (and also the width of the deep contact via 108). Moreover, the length (L) of the area where RIE is performed encompasses an area where four separate shallow contact vias 110 are formed. It should be noted that the leftmost shallow contact via 110 has a smaller width (W2) than the widths (W3) of the remaining three right side shallow contact vias 110 due to the masking effect of the ring-shaped portion of the metallic layer 104 on the leftmost shallow contact via 110. Moreover, it can be seen in FIG. 5A that there is stitching (i.e., overlap) of the leftmost deep contact via 108 and the shallow contact via 110 second from the right.

Figure 6A:
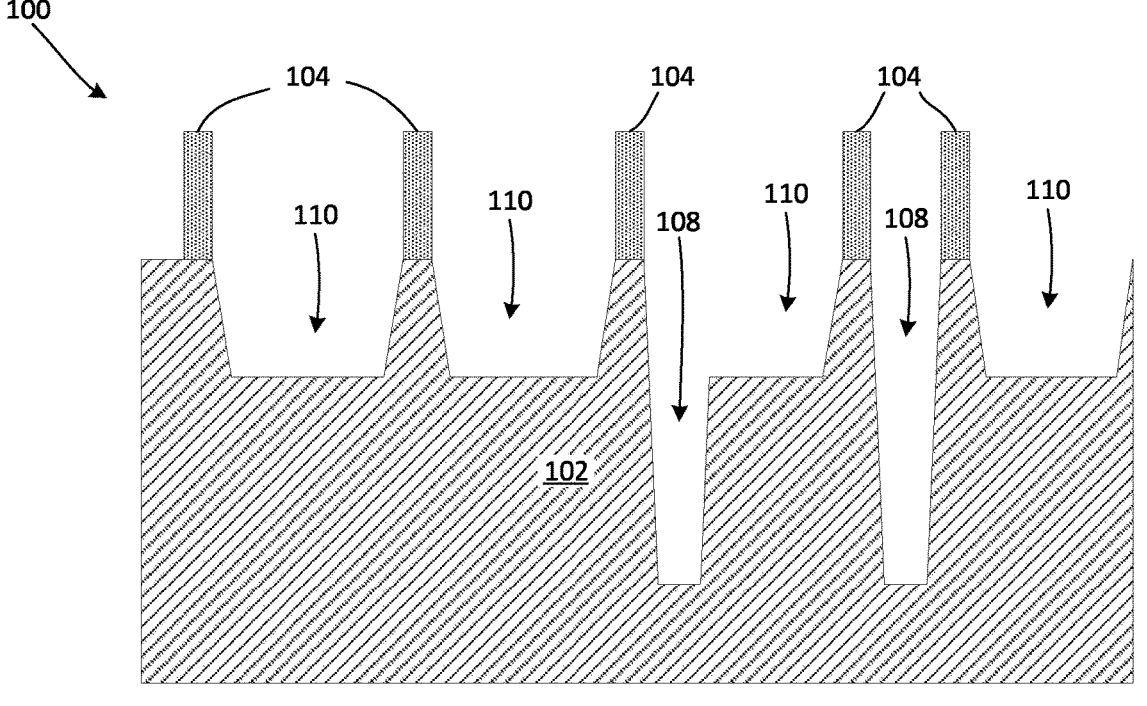
FIG. 6A is a cross-sectional view of the semiconductor device of FIG. 5A after additional fabrication operations and taken along the A line of FIG. 6B, according to embodiments.
Figure 6B:
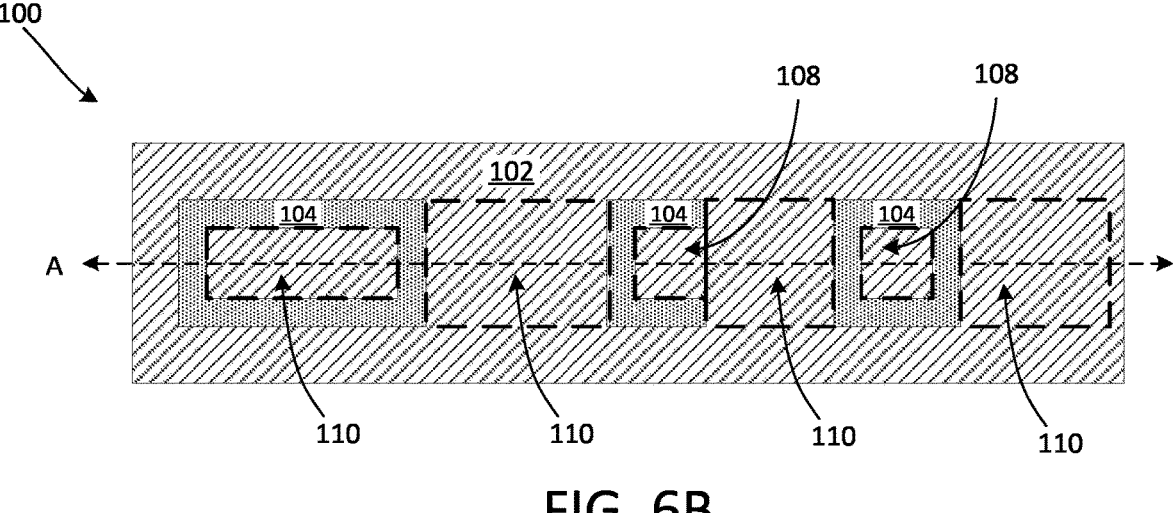
FIG. 6B is a top view of the semiconductor device of FIG. 6A, according to embodiments.

Referring now to FIGS. 6A, this figure depicts a cross-sectional view of the electronic device 100 shown in FIG. 5A after additional manufacturing operations and taken along line A of FIG. 6B, according to embodiments. FIG. 6B is the top-down view (or plan view of FIG. 6A). FIG. 6A shows the deep contact vias 108 and the shallow contact vias 110 with the dashed lines removed for ease of understanding.

Figure 7A:
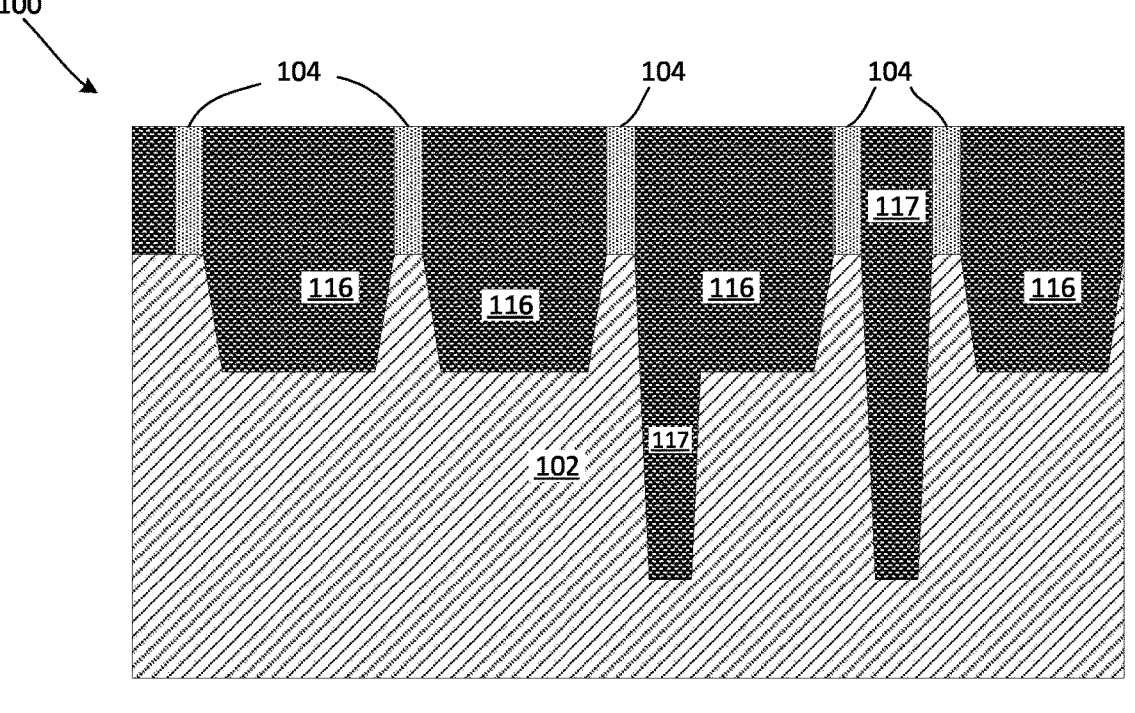
FIG. 7A is a cross-sectional view of the semiconductor device of FIG. 6A after additional fabrication operations and taken along the A line of FIG. 7B, according to embodiments.
Figure 7B:
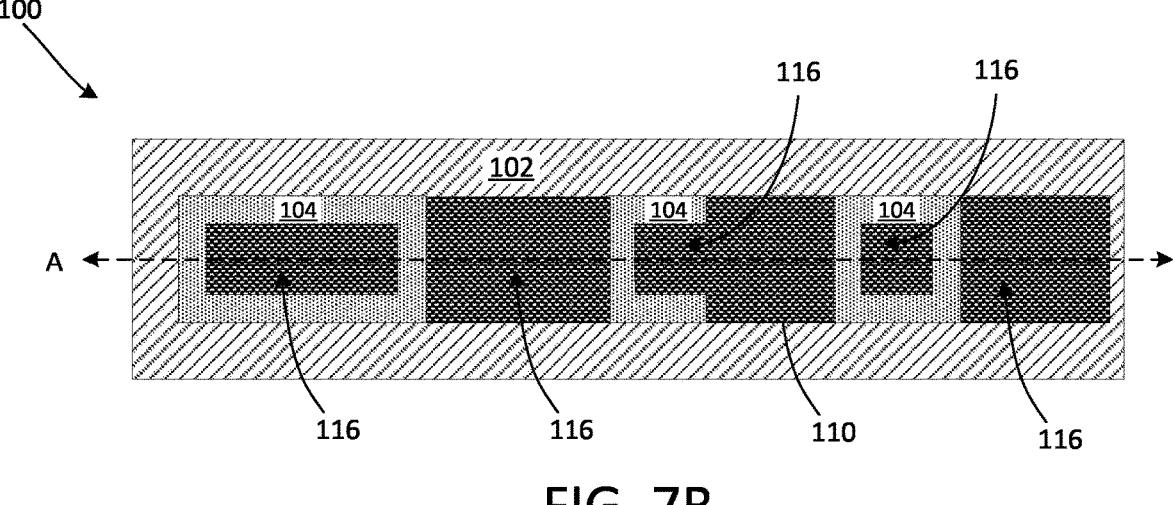
FIG. 7B is a top view of the semiconductor device of FIG. 7A, according to embodiments.

Referring now to FIGS. 7A, this figure depicts a cross-sectional view of the electronic device 100 shown in FIG. 6A after additional manufacturing operations and taken along line A of FIG. 7B, according to embodiments. FIG. 7B is the top-down view (or plan view of FIG. 7A). As shown in FIGS. 7A and 7B, a metal fill operation is performed to form the deep contacts 117 (or deep metal contacts) and the shallow contacts 116 (or shallow metal contacts). As noted above, one of the shallow contacts 116 (i.e., the second shallow contact 116 from the right) intersects with one the deep contacts 117 (i.e., the leftmost deep contact 117) to make an interconnection. It should be appreciated that the number, order and layout of the shallow and deep contacts are merely for purposes of illustration and any suitable different arrangement or numbers of these contacts may be used. In this example, the metal is initially filled to a level that is higher than a top surface of the interlayer dielectric substrate 102 up to about the level of the top of the metallic layer 104 (or metallic spacer layer). Thus, at least at this stage of the process, the metallic layer 104 surrounds at least one of the metal contacts (until a subsequent CMP operation that removes the metallic spacer layers). However, in certain examples, it is sufficient if the metal for the shallow and deep contacts at least fills the deep contact vias 108 and shallow contact vias 108.

Figure 8A:
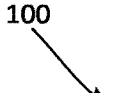
FIG. 8A is a cross-sectional view of the semiconductor device of FIG. 7A after additional fabrication operations and taken along the A line of FIG. 2B, according to embodiments.
Figure 8A:
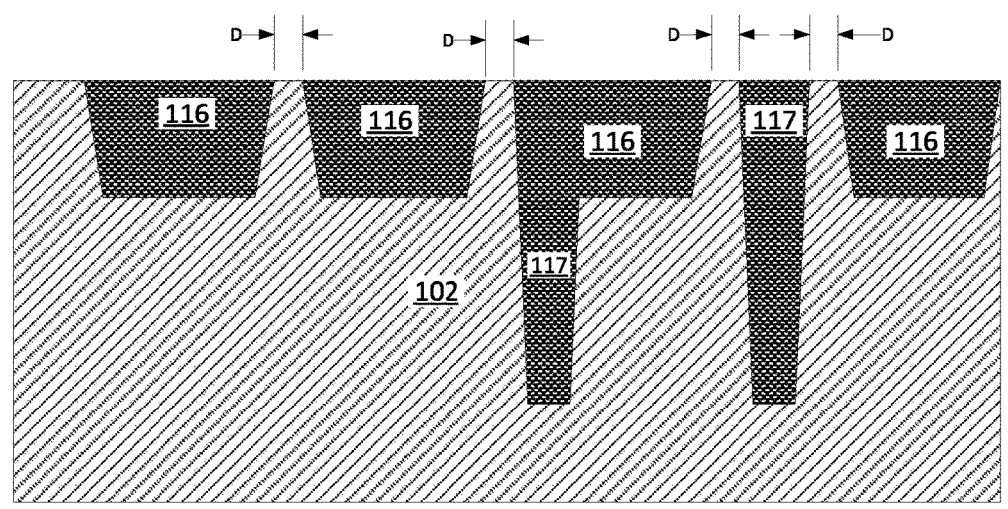
Figure 8B:
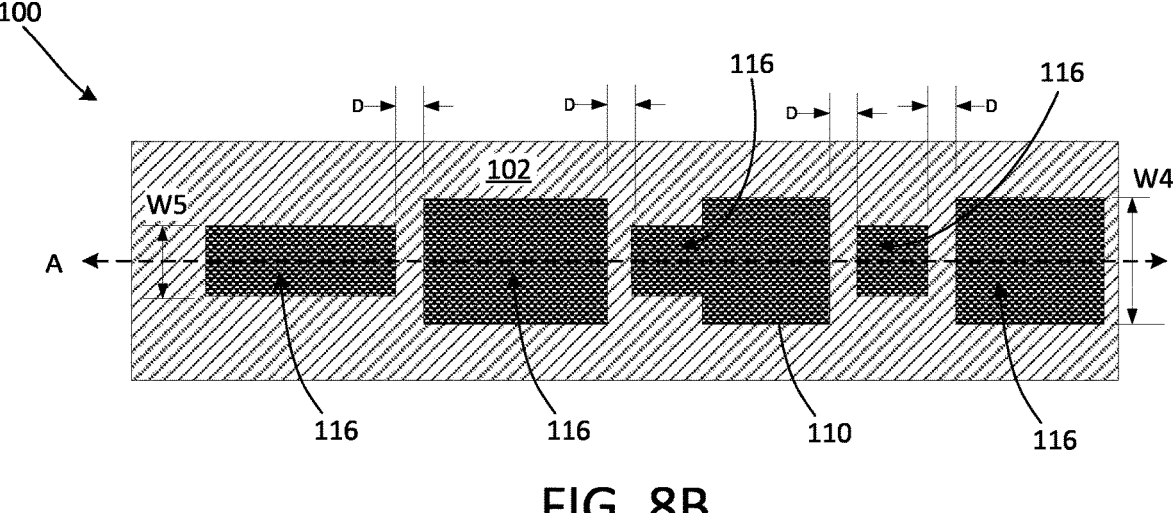
FIG. 8B is a top view of the semiconductor device of FIG. 8A, according to embodiments.

Referring now to FIGS. 8A, this figure depicts a cross-sectional view of the electronic device 100 shown in FIG. 7A after additional manufacturing operations and taken along line A of FIG. 8B, according to embodiments. FIG. 8B is the top-down view (or plan view of FIG. 8A). As shown in FIGS. 8A and 8B, a planarization technique such as CMP is used to remove the metallic layer 104 and the overburden metal material above the interlayer dielectric substrate 102. Thus, in this example, five discrete contact regions are formed. There are three shallow contacts 116, one deep contact 117, and one interconnection that is a combination of a shallow contact 116 and a deep contact 117. The different contact regions may have a width W4 or W5 according to whether or not the metallic layer 104 was present during the via forming process. According to the present embodiments, due to the self-aligned process of forming each of these contacts, a two step process can be used to form the deep and shallow contacts while maintaining an equal spacing D between each of the adjacent contacts. Thus, the problems of misalignment discussed above with the related method of using two separate masks can be avoided.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
an interlayer dielectric layer; and
a plurality of metal contacts formed in the interlayer dielectric layer, the plurality of metal contacts including
a plurality of shallow metal contacts having a first depth, and
a plurality of deep metal contacts having a second depth that is greater than the first depth,
wherein a first one of the shallow metal contacts overlaps and directly contacts a top surface of a first one of the deep metal contacts to form a combined contact, and
wherein a distance between the combined contact and immediately adjacent metal contacts is the same as a distance between adjacent shallow metal contacts.

2. The semiconductor structure of claim 1, wherein the first one of the shallow metal contacts has a width that is greater than a width of the first one of the deep metal contacts.

3. The semiconductor structure of claim 1, wherein at least a second one of the shallow metal contacts has a width that is different than a third one of the shallow metal contacts.

4. The semiconductor structure of claim 1, wherein at least a second one of the shallow metal contacts has a width that is the same as a third one of the shallow metal contacts.

5. The semiconductor structure of claim 1, each of the deep metal contacts has the same width.

6. The semiconductor structure of claim 1, wherein at least a second one of the shallow metal contacts has a width that is the same as at least a second one of the deep metal contacts.

7. The semiconductor structure of claim 1, wherein the first one of the shallow metal contacts and the first one of the deep metal contacts are formed as a single layer.

8. The semiconductor structure of claim 1, further comprising a metallic spacer layer formed between the plurality of metal contacts.

9. The semiconductor structure of claim 8, wherein the metallic spacer layer defines the equal spacing between the plurality of metal contacts.

10. The semiconductor structure of claim 1, wherein at least the first one of the deep metal contacts is electrically connected to a BEOL layer.

11. A method of manufacturing a semiconductor structure, the method comprising:
forming a plurality of metal contacts in an interlayer dielectric layer, the plurality of metal contacts including
a plurality of shallow metal contacts having a first depth, and
a plurality of deep metal contacts having a second depth that is greater than the first depth,
wherein a first one of the shallow metal contacts overlaps and directly contacts a top surface of a first one of the deep metal contacts to form a combined contact, and
wherein a distance between the combined contact and immediately adjacent metal contacts is the same as a distance between adjacent shallow metal contacts.

12. The method of manufacturing the semiconductor structure of claim 11, wherein the first one of the shallow metal contacts has a width that is greater than a width of the first one of the deep metal contacts.

13. The method of manufacturing the semiconductor structure of claim 11, wherein at least a second one of the shallow metal contacts has a width that is different than a third one of the shallow metal contacts.

14. The method of manufacturing the semiconductor structure of claim 11, wherein at least a second one of the shallow metal contacts has a width that is the same as a third one of the shallow metal contacts.

15. The method of manufacturing the semiconductor structure of claim 11, each of the deep metal contacts has the same width.

16. The method of manufacturing the semiconductor structure of claim 11, wherein at least a second one of the shallow metal contacts has a width that is the same as at least a second one of the deep metal contacts.

17. The method of manufacturing the semiconductor structure of claim 11, wherein the first one of the shallow metal contacts and the first one of the deep metal contacts are formed as a single layer.

18. The method of manufacturing the semiconductor structure of claim 11, further comprising forming a metallic spacer layer above and surrounding at least one of the plurality of metal contacts.

19. The method of manufacturing the semiconductor structure of claim 18, wherein the metallic spacer layer defines the equal spacing between the plurality of metal contacts.

20. The method of manufacturing the semiconductor structure of claim 18, further comprising removing the metallic spacer layer.

* * * * *